United States Patent [19]

Chesneau et al.

[11] Patent Number: 4,686,473
[45] Date of Patent: Aug. 11, 1987

[54] DEVICE FOR CREATING AND/OR RECEIVING AN ALTERNATING MAGNETIC FIELD FOR AN APPARATUS USING NUCLEAR MAGNETIC RESONANCE

[75] Inventors: René Chesneau, Sceaux; Claude Prevot, Antony, both of France

[73] Assignee: Thomson-CGR, Paris, France

[21] Appl. No.: 752,874

[22] Filed: Jul. 8, 1985

[30] Foreign Application Priority Data

Jul. 10, 1984 [FR] France .................................. 84 10939

[51] Int. Cl.⁴ ............................................. G01R 33/20
[52] U.S. Cl. ..................................... 324/320; 324/319
[58] Field of Search ............... 324/318, 319, 320, 322, 324/300, 307, 309; 335/216, 299

[56] References Cited

U.S. PATENT DOCUMENTS

| | | | |
|---|---|---|---|
| 4,310,799 | 1/1982 | Hutchison et al. | 324/319 |
| 4,339,718 | 7/1982 | Bull et al. | 324/320 |
| 4,456,881 | 6/1984 | Compton | 324/319 |
| 4,564,812 | 1/1986 | Van Dijk | 324/309 |
| 4,591,818 | 5/1986 | Butson | 324/320 |
| 4,602,234 | 7/1986 | Butson | 324/320 |

FOREIGN PATENT DOCUMENTS

| | | |
|---|---|---|
| 71896 | 2/1983 | European Pat. Off. . |
| 73375 | 3/1983 | European Pat. Off. . |
| 84946 | 8/1983 | European Pat. Off. . |
| 107238 | 5/1984 | European Pat. Off. . |

Primary Examiner—Michael J. Tokar
Attorney, Agent, or Firm—Pollock, VandeSande & Priddy

[57] ABSTRACT

The invention provides a device for creating an excitation field in an apparatus using nuclear magnetic resonance. The structure for creating this field comprises a number of conductors spaced evenly apart at the periphery of a circular cylinder. What characterizes the invention is that, for producing a homogeneous field inside this cylinder, it is sufficient to cause a current to flow through these conductors whose intensity is proportional to the cosine of the angle which locates this conductor with respect to a reference axis system.

16 Claims, 9 Drawing Figures

DEVICE FOR CREATING AND/OR RECEIVING AN ALTERNATING MAGNETIC FIELD FOR AN APPARATUS USING NUCLEAR MAGNETIC RESONANCE

FIELD OF THE INVENTION

The invention relates to a device for creating and/or receiving an alternating magnetic field for apparatus using nuclear magnetic resonance. It finds its application particularly in the medical field.

BACKGROUND

An apparatus for measuring nuclear magnetic resonance comprises essentially an apparatus for creating a static magnetic field (or simply static field) $B_O$ directed along an axis Z'Z, apparatus for creating a first field gradient along the same axis and apparatus for creating a second field gradient along a plane perpendicular to this axis. With such constant fields, a line can be discriminated in a slice of an examination volume. Since the magnetic moments of the nuclei of bodies subjected to these fields are oriented by the static field, precession is obtained by means of an alternating excitation magnetic field. The frequency of this excitation field is determined as a function of the intensity of the static field. The frequency corresponds to the free precession rate of the moments of the nuclei under the effect of this static field. Typically, for a static field varying between 0.15 teslas and 2 teslas this frequency lies between 6 MHz and 80 MHz and therefore the excitation field is often referred to as an r.f. field. For a given structure of the means creating the static field and so for a given intensity thereof, the excitation frequency is determined. The r.f. field is orthogonal to the static field. The field lines of the r.f. field are therefore contained in planes parallel to the direction of the second field gradient.

DESCRIPTION OF THE PRIOR ART

The essential characteristics of the r.f. field is its homogeneity. In fact, all the nuclei of the body situated in the volume, slice or line under investigation should be excited in a similar manner. A device described in European patent application. No. 82 107 332.7 has a structure adapted for creating such a field. It comprises four substantially parallel conducting wires situated on the ges of a rectangular parallelepiped. Two conductors situated on each side of a face of this parallelepiped support a current equal but opposite in direction to the current which flows through the two conductors situated on each side of the face opposite this face. The r.f. field produced is substantially perpendicular to the other two faces of this parallelepiped. It can be determined that the inhomogeneity, not only in intensity but also in direction, of this r.f. field created is of the order of 10% in a reduced volume of 50% with respect to the volume of the parallelepiped. In an apparatus using the phenomenon of nuclear magnetic resonance, the transmission structure also serves as reception antenna for measuring the energy yielded by the nuclei during their return to the orientated state. Consequently, the inhomogeneity at transmission is also applicable at reception. The result is an inhomogeneity of the received signal of the order of 20%. One of the aims of the present invention is to improve the homogeneity of the r.f. field.

Furthermore, the r.f. field such as defined above, in the useful zone (the one which is circumscribed by the parallelepiped), remains always orientated in a single direction. According to a universally accepted representation an alternating field of contact direction may be resolved into two components, with constant intensity, with symmetrical orientation with respect to this alternating field and rotating in opposite directions. Now, for exciting the nuclei, only one of these rotating components is useful. It is the component which rotates in a suitable direction with respect to the direction of the static field $B_O$. Consequently, at transmission, for a given intensity of the r.f. field, the result is an excitation of the nuclei which is reduced by 50%. Similarly, at reception, for a given precession of the nuclei the measurement of the energy is proportional to half this precession. Consequently, although the power brought into play at transmission is greater than the useful power, at reception the power received is less than the power emitted by the nuclei. The loss of efficiency at transmission may be neglected however the power of this transmission must be reduced for physiological reasons when the body examined is a human body. On the other hand, the lack of sensitivity at reception results in an attenuation of the received signal which is very troublesome because of the very weakness of the signals emitted by the nuclei. In practice, the energy measured is of the order of 150 dB under a watt.

The purpose of the present invention is to overcome the above mentioned drawbacks by proposing an excitation structure adapted for creating a more homogeneous r.f. field and moreover adapted for creating and receiving a rotary excitation field.

SUMMARY OF THE INVENTION

The invention relates to a device for creating and/or receiving an alternating magnetic field for an apparatus using nuclear magnetic resonance, in which substantially parallel conducting wires support a current corresponding to homogeneous (static) magnetic field in the volume which they circumscribe. According to the invention, the apparatus further comprises means for causing a current to flow through the conductors whose intensity is a trigonometrical function of the polar coordinates of each of the conductors with respect to a reference axis system orthogonal to the conductors.

The invention also relates to a device for creating and/or receiving an alternating magnetic field for an apparatus using nuclear magnetic resonance in which substantially parallel conductors support a current corresponding to homogeneous (static) magnetic field in the volume which they circumscribe, further comprising means for producing rotation between the phases of the different currents so as to correspond to a rotating magnetic field.

BRIEF DESCRIPTION OF THE DRAWINGS

The invention will be better understood from the following description and accompanying Figures. This description is given purely by way of indication and is not limitative of the invention. In the Figures, the same references designate the same elements. In the drawings.

DESCRIPTION OF THE PREFERRED EMBODIMENTS

Figure 1A:
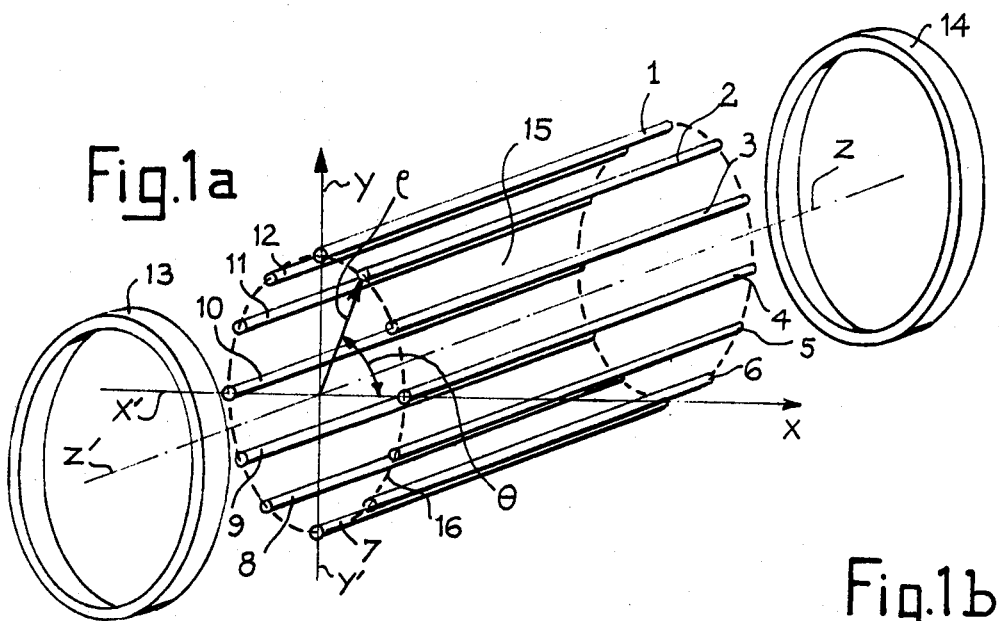
FIGS. 1a and 1b show a particular distribution of the conducting wires of the device of the invention.

FIG. 1a shows in perspective conducting wires numbered 1 to 12. These conductors are substantially parallel to each other and to an axis Z'Z. Axis Z'Z is the axis of the static field $B_O$ of an apparatus using nuclear magnetic resonance. This apparatus is shown symbolically by its two static field coils 13 and 14. The apparatus further comprises assemblies (not shown, because they are well known and independent of the invention) of gradient coils as well as a general assembly for transmission-reception and signal processing circuits. Axis Z'Z is perpendicular to a system of reference axes X'X and Y'Y. With respect to this system of axes each of the conductors is referenced by its polar coordinates $\rho$ and $\theta$. What characterizes the invention is, for producing a homogeneous alternating magnetic field within the volume circumscribed by the conductors, that the intensity of the electric current which flows through these conductors is a trigonometric function of their polar coordinates. In other words, in each conductor there flows a particular current. In the case where the volume 15 circumscribed by the conductors is a circular cylinder whose generatrices are based on a circle 16, the trigonometric function is $I_O \cos \theta$. In this particularly simple case, having regard to the homogeneity, the intensity is even independent of the locating modulus $\rho$ of each of the conductors.

Figure 1B:
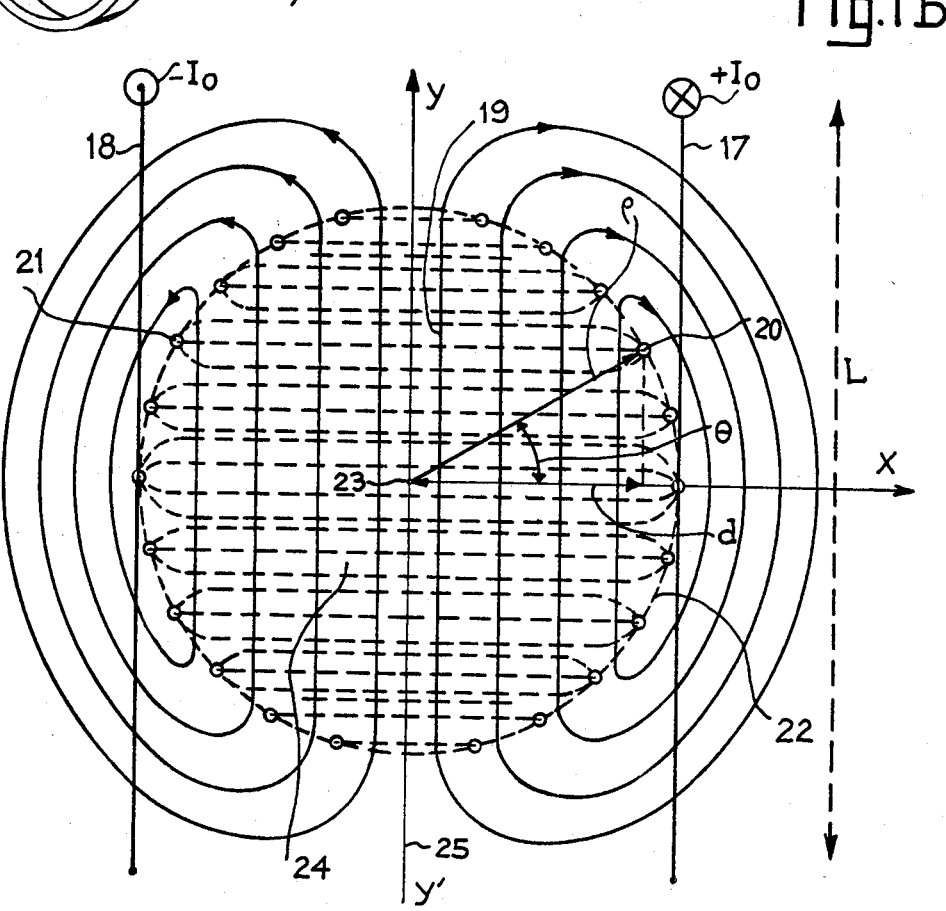

FIG. 1b, a view in section through a plane parallel to X'X-X'Y, allows a simple explanation of this phenomenon to be given. Let us consider two parallel plates 17 and 18 of width L having respectively flowing therethrough a current $+I_O$ and $-I_O$. The currents $\pm I_O$ are uniformly distributed in the section of each plate: the current in plate 17 moves away from the observer (representation of arrow feathers) the current in plate 18 moves nearer the observer (arrow tip represented). The electric field produced between the plates is perpendicular to their surface. In this Figure, the electric field lines are shown with broken lines and the magnetic field s by continuous lines. The magnetic field, at all ints perpendicular to the electric field as well as to ne currents $\pm I_O$, comprises field line segments such as 19 which are rectilinear. For a given dimension of width L, it is possible to determine a volume, relatively small with respect to width L, in which all the rectilinear magnetic field segments are parallel to each other and correspond to a field of equal intensity. This magnetic field is then perfectly homogeneous since the electric field between the plates is uniform.

The spirit of the invention consists in replacing the two plates 17 and 18 by an assembly of conducting wires such as 20 and 21 sufficiently close to each other to produce the desired field uniformity. These conductors each have a current flowing therethrough of suitable intensity for reproducing the same uniform electric field state. Consequently, the same homogeneous magnetic field state will also be reproduced. The suitable intensity which flows through each of the conductors is related to the coordinates of the position where these conductors intersect a contour 22. The coordinates of the points of contour 22 are referenced with respect to the center 23 of the section 24 of the volume in which it is desired to produce the homogeneous magnetic field. So as to obtain a given electric field between two paired conductors (20, 21), the potential difference which exists between these two conductors must be adjusted proportionally to the distance which separates them. Stated differently, considering each conductor separately, this potential difference should be made proportional to the distance d which separates this conductor from a mean plane 25 secant to section 24. Having regard to center 23, this distance d is equal to $\rho \cos \theta$. Therefore the potential difference must be dependent on $\rho \cos \theta$. For an equal resistance of all the conductors, the current which flows through each of the conductors must then be a function or $\rho \cos \theta 0$: that is to say a trigonometric function of the location of this conductor.

In one embodiment, contour 22 is a circle: the circle 16 of FIG. 1a; the conductors are evenly spaced apart about the periphery of the cylindrical volume 15; they are placed symmetrically to each other with respect to the plane 25 corresponding to the plane Y'Y-Z'Z. In the example shown where the number of conductors is 12, the difference of angle at the center which locates two adjacent conductors is equal to 30°. Thus, a defect of homogeneity is obtained of the order of 1% in a reduced volume of 50% with respect to the volume of the cylinder. The 10% homogeneity zone is then substantially increased by 50% with respect to the preceding case. The homogeneity may be further increased by increasing the number of conductors. However, arrangements other than circular cylinders may be chosen for volume 15. What is important is to create the uniform electric field between all the conductors so as to create a corresponding homogeneous magnetic field. In this case, the current in each conductor is of the type $I_O \rho \cos \theta$.

Figure 1C:
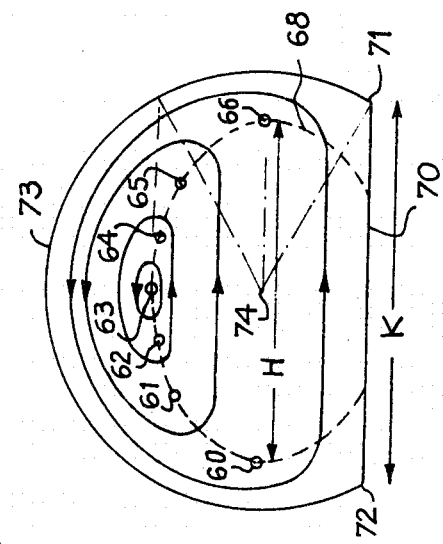
FIGS. 1c and 1d show a preferred variant of the preceding distribution.
Figure 1D:
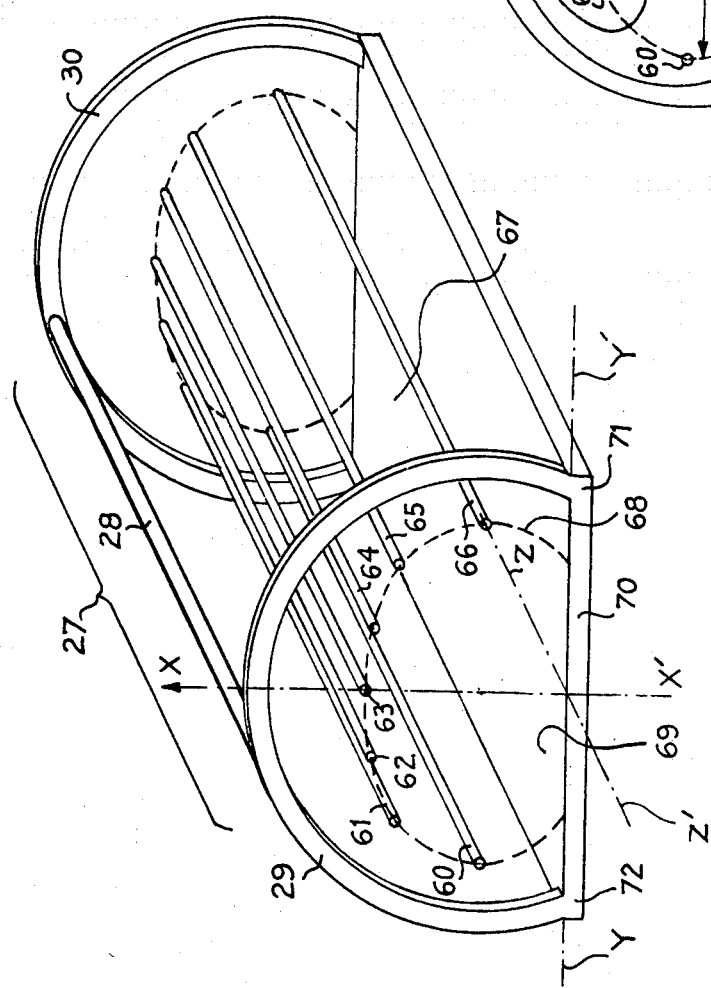

FIGS. 1c and 1d show a preferred variant of the structure of the conductors. In these Figures an assembly of conductors numbered 60 to 66 circumscribe a cylinder 67 based partially on a contour 68. Cylinder 67 comprises in addition a flat face 69. Face 69 is formed by the surface of a metal plate 70. This plate 70 is the patient carrying plate of the nuclear magnetic resonance apparatus. This plate is situated at the position of plane 25 of FIG. 1b. The presence of this metal plate is justified to the extent that an equipotential surface is thus provided. This equipotential surface is placed in the electric field described in FIG. 1b, so that it does not disturb this field. There is then no need to create the electric field in the volume masked by this plate and this makes pointless the existence of a symmetrical set of conductors. In fact, the return current flows through the plate itself. The presence of a flat metal face imposes an equipotential surface, resulting in a uniform electric field perpendicular to this surface and consequently a homogeneous magnetic field parallel to this surface. This variant, which coordinates with the requirement of the patient carrying plate, shows the variety of solutions possible for the contours on which the generatrices of the cylinder bear.

For reasons which will be explained further on, cylinder 67 is contained in a Faraday cage 27. Cage 27 comprises essentially two metal hoops 29 and 30 connected together by a set of metal bars such as 28. The hoops further rest at their bases on the edges 71 and 72 of plate 70. The plate forms an integral part of this Faraday cage: it closes it. FIG. 1d shows, in section through a plane XY, the device of FIG. 1c. Cage 27 has therein a profile in the shape of a circle portion 73 centered at 74. Plate 70 forms the chord of an arc of a circle whose angle at the center is equal to about 120°: angle 72-74-71. The conductors are spaced apart over contour 68 which has substantially the shape of an ellipsis whose large axis, parallel to plate 70, passes through the center 74. The large diameter H of this ellipsis is less than the width K of the plate. The conductors 60 and 66, the closest to plate 70, pass substantially through the plane of the large axis of contour 68. The small diameter of the ellipsis is substantially equal to twice the distance which separates center 74 from plate 70. Thus, the current which flows through each of these conductors has an intensity substantially half that which flows through the conductor 63, the furthest from the plate.

Figure 2:
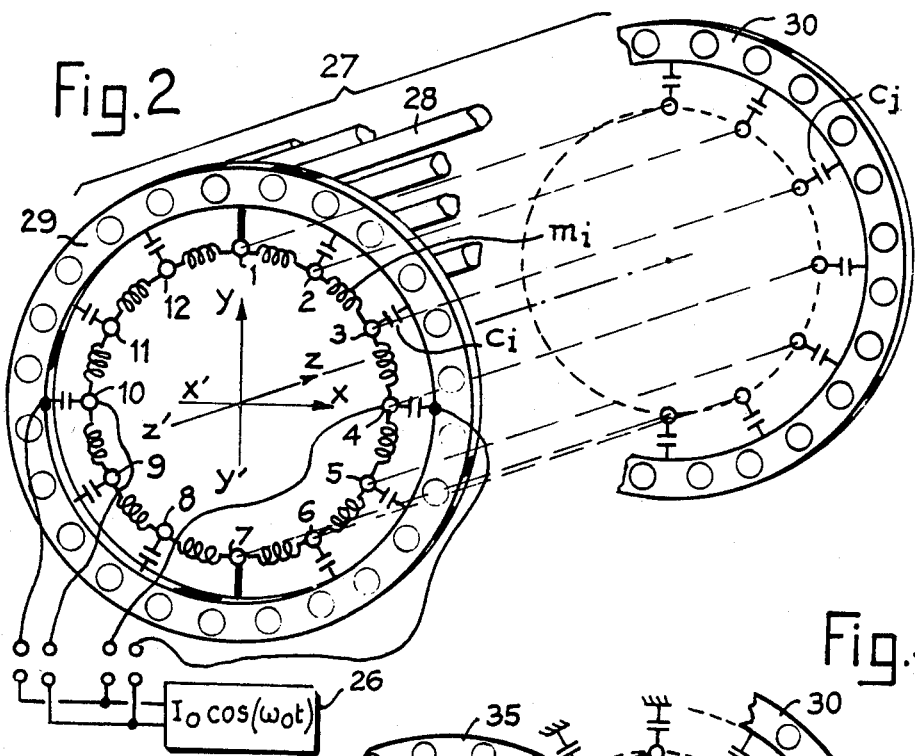
FIG. 2 shows a particular power supply circuit in accordance with the invention.

FIG. 2 shows a device for supplying the conductors of FIG. 1a with electric power. A similar power supply device may be used for the conductors of FIG. 1c. It was seen above that each conductor must be supplied by a source of current whose intensity is a function of the polar coordinates of the wires with respect to a reference axis system. All these current sources must of course be in phase with respect to the oscillation frequency of the alternating magnetic field thus created. In a voltage supply circuit described in FIG. 2, this power supply is obtained by means of a single generator: generator 26. One of the additional characteristics of the invention consists in remarking that variation of the intensity as a function of the location of the conductor may be obtained simply by supplying these conductors by means of an ultra high frequency line. It is known that the amplitude of the wave created in the line is a function of the coordinates of each point of the line with respect to the origin of this line.

In fact, this amplitude $A_1$ is a function of the cosine of the ratio of the abscissa 1 of a point considered to the wave length. This may be written:

$$A_1 = A_0 \cos\left(2\pi \cdot \frac{l}{\lambda}\right)$$

where 1 represents the distance which separates a point of the line from the origin of this line. This formula is of ᴜrse only valid if the line is a mismatched line and ɩy if its standing wave ratio is therefore infinite. In the ⸝ower suply circuit of FIG. 2, the line is wound about the circle 16. The wave length is determined on the one hand by the frequency of the alternating wave and on the other hand by the speed of propagation of this wave in the line. At the frequencies considered, between 6 and 80 MHz, the wave length in a vacuum or in air is between 20 m and 3.75 m. On the other hand, the circumference of circle 16 is generally of the order of 2 m. In fact, the diameter of the circle is equal to about 0.6 m: it is calculated so as to be able to introduce the body of a patient therein.

Two solutions may then be envisaged. A first solution, using the conditions of propagation of electric waves in a vacuum, will consist in causing a twin wire ultra-high frequency line, for example coaxial, of a length adapted to the wave length in a vacuum to undulate so that the base of the undulations is projected on circle 16 at the position of connection of the conducting wires. A second solution consists in forming an ultra high frequency line with lumped constants. This solution, which is the preferred solution, is shown in FIG. 2.

For constructing the ultrahigh frequency line, advantage is taken of the existence of a Faraday cage 27 which is normally formed about the assembly of excitation conductors. The existence of the Faraday cage 27 is imposed by the need to prevent the r.f. field from disturbing the operation of the static field coils and of the gradient coils. The Faraday cage has an open work construction so as, on the otherhand, to allow these static or gradient fields to penetrate into volume 15. In one embodiment, this Faraday cage 27 is formed, like the excitation structure, from metal bars such as 28 connected together at each end by two rings 29 and 30 coaxial to cylinder 15. The diameter of these rings is slightly greater than the diameter of circle 16. In one example the number of bars 28 is equal to twice the number of conductors. The space which separates the rings from circle 16 is substantially equal to half the distance which separates two adjacent conductors on the cylinder.

The ultra high frequency power supply line is formed on the one hand by ring 29 and on the other by an assembly of inductors-capacity cells $m_i$-$c_i$. The inductances $m_i$ are placed on circle 16 perpendicularly to the generatrices of the cylinder. Capacitors $c_i$ connect each conductor radially to ring 29. The calculation of these inductances and of these capacities is given by the following equations:

$$Z_c = \sqrt{\frac{M}{C}} \; ; MC\,v^2 = 1; \text{ and } \frac{1}{f_0} \cdot v = \lambda.$$

In these formulae, $Z_c$ is the characteristic impedance of the line equal to the output impedance of generator 26, M and C are the apparent inductance and capacitance of the line, v is the phase speed or propagation speed of the wave in the line, fo is the frequency of the alternating wave and λ is the real wave length created. In short, so that the wave propagates from one point of the line to another, taking into account the fact that the length of this line is imposed (it is equal to the circumference of circle 16), it is the phase speed of the created wave which must be matched. In other words, knowing λ which is equal to the circumference of circle 16, a phase speed v is deduced therefrom. Further knowing the characteristic impedance of generator 26, M and C can then be calculated. The values $m_i$ and $c_i$ are derived from these values of M and C and from the number of conductors which it is desired to position.

The conductors are connected at one of their ends to the $m_i$-$c_i$ cells: at the point of connection of the inductance and of the capacity. At their other end, they are connected to ring 30 by capacitors $c_j$. The purpose of the presence of capacitors $c_j$ is to tune the lines represented by the conductors so as to cause them to resonate. The size of capacitors $c_j$ are determined by the length of the conductors relatively to the wave length in a vacuum of the excitation wave. The length of the conductors must be less than half this wave length in a vacuum.

So that the conductors situated at the right of the plane Y'Y-Z'Z have flowing therethrough a current in phase opposite (cosine $\pi - \theta = -\cos\theta$) the line is fed in phase opposition at two diametrically opposite points. The line is then formed from four quarter-wave elements: a first element between conductor 1 and conductor 4, a second element between conductor 4 and conductor 7, a third element between conductor 7 and conductor 10 and a fourth element between conductor 10 and conductor 1. The voltage power supply 26 is applied to the terminals of the line, in phase opposition, between conductor 4 and ring 29 on the one hand and between conductor 10 and ring 29 on the other. The conductors 1 and 7, at their end connected to the line are short circuited to ring 29. These short circuits provide a voltage node at these points with respect to the voltage antinodes which exist at the power supply points. Thus, we have paired conductors, pairs 2-12, 3-11, 4-10, 5-9 and 6-8. Conductors 1 and 7 are "paired" with themselves. It can be seen that the currents in each of the paired conductors are equal to each other but of opposite signs. The currents in conductors 8 to 12 flow permanently in a direction opposite the current in conductors 2 to 6. The intensities of these currents follow the law $I_O \cos \theta$. The result is the expected homogeneous field within volume 15 circumscribed by the conductors.

In the above described variant of FIGS. 1c and 1d, there is only one phase to be supplied. The supply may be provided here again with an ultrahigh frequency line. The supply is provided between conductors 63 and ring 29. The voltage nodes are provided by connecting the edges 71 and 72 of the plate to ring 29. The advantage which follows from only supplying one phase consists in only having one set of capacitors $c_j$ to tune since there is only one set of conductors.

Figure 3A:
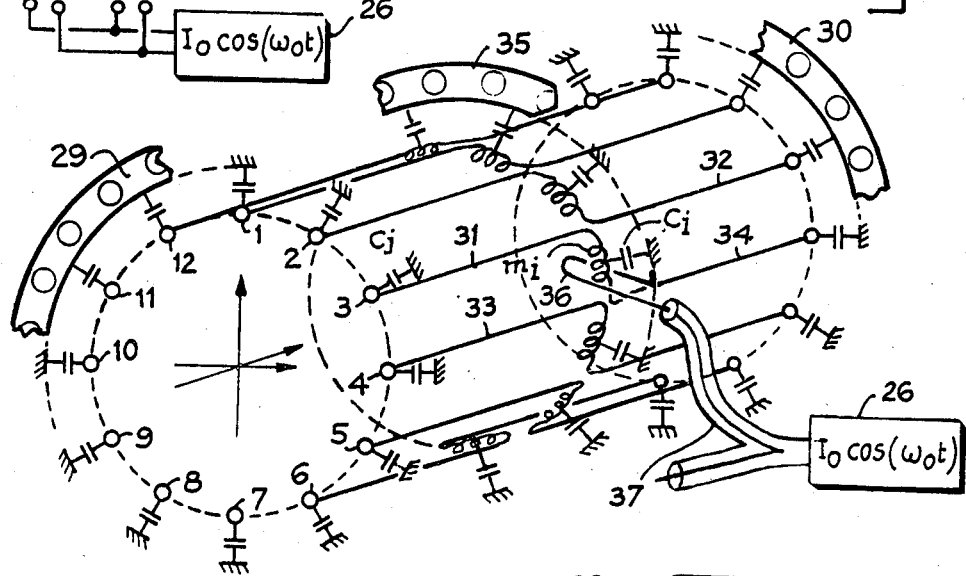
FIGS. 3a to 3c show a variant of the power supply circuit of the preceding Figure.
Figure 3B:
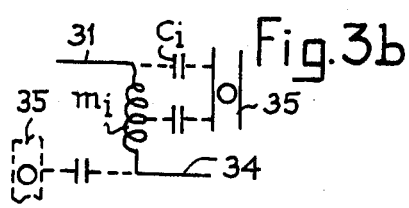
Figure 3C:
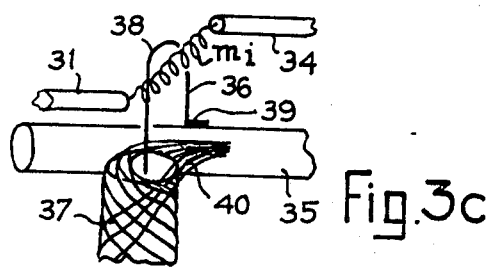

FIGS. 3a to 3c show another method of supplying the conductors with power. FIGS. 3a–3c is a current power supply which is the dual to the voltage power supply of FIG. 2. The ultra-high frequency power supply line is formed under the same conditions and from the same basic equations. The structure of the conductors is slightly different: each conductor is formed from two segments. Thus, for example, conductor 3 comprises a segment 31 and a segment 32. Similarly, conductor 4 comprises segment 33 and a segment 34, etc. In a preferred embodiment, the inductances $m_i$ are disposed substantially in the middle of the conductors. They are connected by one pole to an end of a segment of one conductor and by their other pole to one end of a complementary segment of an adjacent conductor. As shown in FIG. 3b, capacitors $c_i$ are connected on the one hand to a third circular ring 35 and on the other to ⸱ of the ends of inductance $m_i$ or even possibly to the ⸱ddle point thereof. Ring 35 is placed at mid height of ⸱he cylinder and so at mid length of the conductors. These connections of capacitors $c_i$ are equivalent. They are equivalent to replacing the $\pi$ shaped $m_i$-$c_i$ cells by T shaped $m_i$-$c_i$ cells. The power supply is applied to the line by inductive coupling of the field created by means of a loop of the core 36 of a coaxial cable 37. FIG. 3c shows this inductive coupling. Core 36 forms a loop 38 inducing the excitation wave in coil $m_i$. The end 39 of core 36 is connected, beyond the loop 38, to the ring 35. Similarly, the braid 40 of cable 37 is also connected to ring 35. The advantage provided by this power supply by coupling resides in the simplicity in supplying the conductors, in phase or in phase opposition. From one situation to the other, it is sufficient to reverse the winding direction of loop 38 about inductance $m_i$ so as to change the polarity of the current which flows in the conductors.

The current power supply through loop 38 simplifies the methods of connecting generator 26 since it is no longer necessary to use switches for driving two points of the line in phase opposition. It should be noted that in FIG. 3a, as in FIG. 2, there exists a second power supply point diametrically opposite the one described. This second point has not been shown here so as not to overload the drawings.

Another advantage of a current power supply with respect to the voltage power supply of FIG. 2 resides in the fact that a current antinode is formed in the ring 35 since the power supply is a current supply. Consequently, at the position of ring 35 there is a voltage node so a zero electric field. The electric field is therefore reversed at the position of ring 29 with respect to the electric field at the position of ring 30. Consequently, the intensities of these two electric fields are less than half the electric field opposite ring 29 of FIG. 2. A further difference with respect to the structure of FIG. 2 is that all the conductor segments are connected, at their end which is not connected to inductances $m_i$, to rings 29 and 30 by resonance capacitors $c_j$. In the preferred embodiment, the complementary segments of a conductor are of equal length. This is, however, not required but has the advantage of reducing the electric field in the body being examined. The current power supply is quite applicable to the preferred embodiment. The conductors 60 to 66 of FIG. 1c take the place of conductors 1 to 7 of FIG. 3a: there is now only one power supply point.

Figure 4:
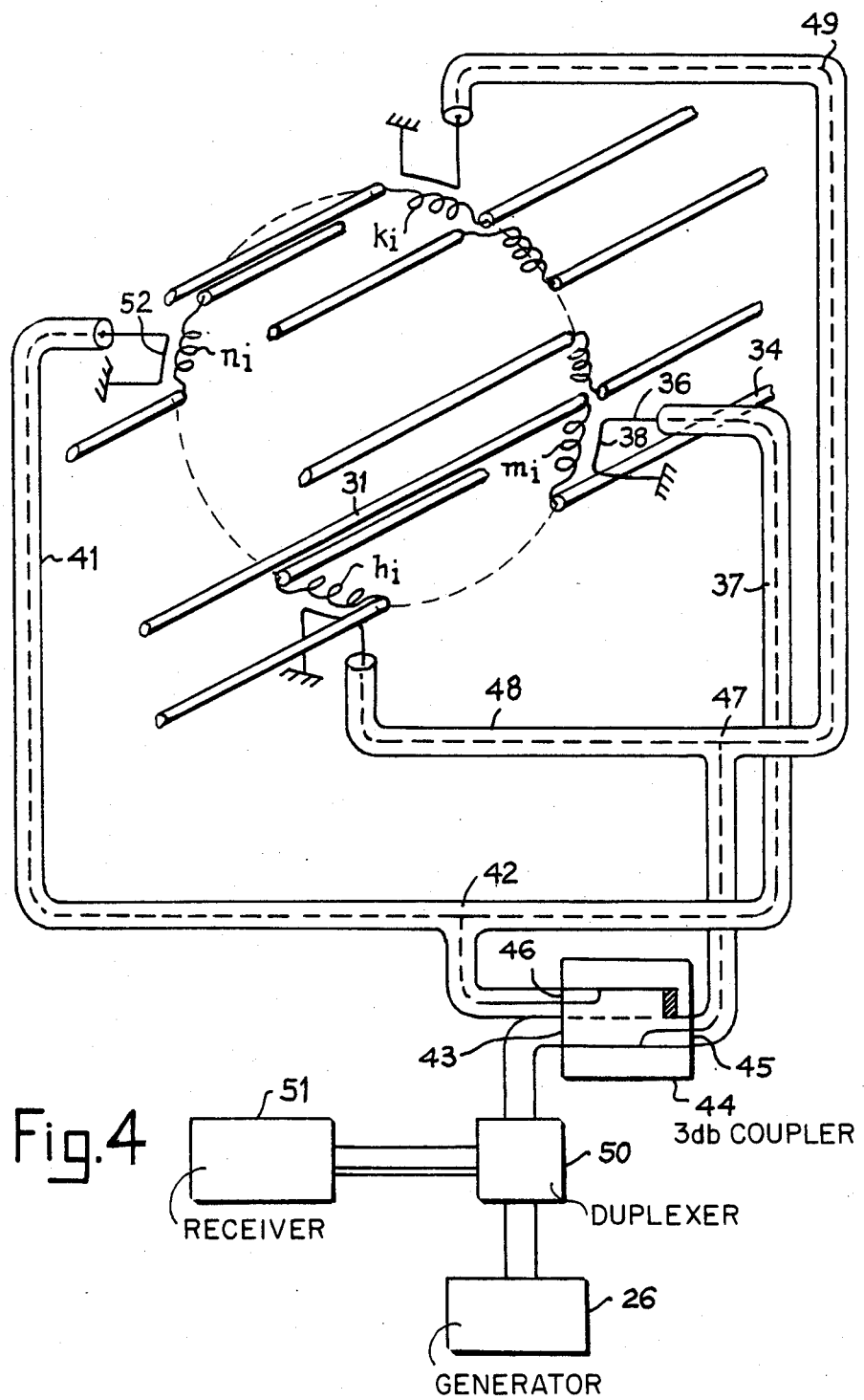
FIG. 4 show a power supply circuit for the conducting wires adapted for creating a rotating field.

FIG. 4 shows an assembly of means adapted for creating a rotating r.f. field. FIG. 4 is simplified with respect to FIG. 3a. There can be seen the supply of power via magnetic coupling with the inductors $m_i$ which, in turn, are connected on each side to conductor segments 31 and 34. FIG. 4 also shows as was mentioned above, supply of power via magnetic coupling with the inductor $n_i$ diametrically opposite the inductor $m_i$. It will be noted that the two couplings from the coaxial cable 37 on the one hand and from a coaxial cable 41 on the other, both coming from a branch 42, are provided in phase opposition: loops 38 and 52 of the cores of these coaxial cables being of reversed orientation. What characterizes the creation of a rotating field in the invention is that the conductors are supplied with power with a variable phase depending on their location on the cylinder.

Thus generator 26 is connected to one input 43 of a 3 dB coupler 44. Coupler 44 has two outputs respectively 45 and 46. It is known that the two outputs of such a coupler have a phase shift of 90° with respect to each other. The waves which emerge therefrom are then in phase quadrature. They are moreover of equal intensity. The wave which emerges from output 46 is directed towards the shunter 42 for supplying the two inductors $n_i$ and $m_i$. The wave which leaves the output 45 is directed towards a shunter 47 which supplies, through coaxial cables 48 and 49 according to similar arrangements, two inductors $h_i$ and $k_i$ diametrically opposite each other and disposed at right angles to the alignment of inductors $n_i$–$m_i$. The perfectly symmetrical circular structure of the excitation structure of FIG. 3a, results in a current flowing in each conductor whose intensity is given by:

$$I = I_o \cos(2\pi f_o t + \theta)$$

The amplitude of the current in each conductor is then equal to $I_O$: the phase of the current in each conductor is equal to the location angle of the conductor. It can be shown that this distribution of the currents is of a kind to produce a rotating field of intensity proportional to $I_O$ and whose speed of rotation in space corresponds to the frequency of the alternating field. Of course, the phase shifts are arranged so as to cause the field to rotate in the suitable direction with respect to the direction of precession of the magnetic moments of the nuclei.

In the embodiment described, the line is supplied at four points. It is, however, possible to supply it at N points by phase shifting the sources with respect to each other successively by an amount of $2\pi/N$. The embodiment shown in FIG. 4 has the advantage of lending itself to the excitation of a rotating field and being further adapted to the reception of such a field. In fact, after the excitation phase of the nuclei, for measuring the return signal from the freely precessing nuclei, the same structure is used comprising the ultra high frequency line, the coupling circuits of the cores of the coaxial cables, the shunters and the 3 dB coupler. However, between coupler 44 and generator 26 there is inserted a duplexer 50 which directs the received signals towards a receiver 51. The presence of receiver 51 shows symbolically all the processing carried out on received signals for revealing the information which they contain. In short, the signal which leaves duplexer 50 for receiver 51 is of an intensity twice as high as the one which would have been received if the excitation device had not comprised means for creating a rotating field.

The means for creating a rotating field which are described here as an improvement to the means for creating a homogeneous alternating field may, however, be used independently of any consideration of homogeneity. In particular, in applications where a volume response of the body is desired, the homogeneity may be neglected in favor of a 3 dB gain at reception. Thus, a structure having three conductors supplied with phase shifts respectively of $2\pi/3$, and distributed at the apices of an equilateral triangle is equivalent to a pair of parallel conductors rotating about an axis situated in the middle of these two conductors. Thus, the field would not be very homogeneous but on the other hand it would be rotating. In this embodiment, a single generator would be used and each of the three conductors would be fed after the excitation signal has passed into a first and into a second $2\pi/3$ phase shifter.

What is claimed is:

1. A device for generating and/or receiving an alternating magnetic field for an apparatus using nuclear magnetic resonance comprising parallel elongated conducting wires disposed on a non-circular cylinder, means for causing a current to flow through each conducting wire of intensity corresponding to a trigonometric function, $\rho \cos \theta$, of polar coordinates $\rho, \theta$ of each of said conducting wires with respect to an origin of a system of reference axes orthogonal to the conducting wires in order to generate a homogeneous radio frequency magnetic field in a volume circumscribed by said conducting wires, said system of reference axes centered on a center of said volume.

2. A device as claimed in claim 1, wherein said conducting wires are spaced apart over the surface of said non-circular cylinder, said non-circular cylinder having a flat metal face serving as patient carrying plate and as a return path for the current.

3. A device as claimed in claim 1 further comprising electric power supply means for supplying a radio frequency signal to the conducting wires including an ultra-high frequency line orthogonal to said conducting wires with a phase speed adapted to the length of a contour on which the conducting wires bear.

4. A device as claimed in claim 3, wherein said ultra-high frequency line includes lumped elements whose phase speed determines a wave length equal to the perimeter of the contour on which the generatrices of the cylinder bear and this ultra-high frequency line is supplied at, at least, a first position and is short circuited at two diametrically opposite second positions disposed at right angles from the first position.

5. A device as claimed in claim 3, wherein said electric power supply means comprise an ultra-high frequency line extending along the contour on which the non-circular cylinder bears which encloses the circumscribed volume, said ultra-high frequency line includes lumped elements, and whose phase speed determines a wave length corresponding to the length of this contour, and said ultra-high frequency line comprises an assembly of induction coils inserted in series between two complementary segments of two adjacent conducting wires and said ultra-high frequency line is supplied at at least one position.

6. A device according to claim 5, wherein said one position is situated at mid height of said non-circular cylinder.

7. A device as claimed in any one of claims 3 to 6, wherein said ultra-high frequency is formed from T cells.

8. A device as claimed in any one of claims 3 to 6, wherein the ultra-high frequency line is formed from $\pi$ cells.

9. A device as claimed in any one of claims 1 to 6, wherein the assembly of conducting wires is contained in a Faraday cage and the ends of said conducting wires are connected to said cage by capacitors.

10. The device as claimed in any one of claims 3 to 6, wherein the circuit for supplying the line with power comprises coaxial cables the core at one end of which is magnetically coupled to the line and the shielding braid of which is connected electrically to the line.

11. A device as claimed in claim 3 comprising phase rotation means for supplying different positions along the ultra-high frequency line with phase shifted energy so as to produce a rotating magnetic field.

12. A device as claimed in claim 5 comprising phase rotation means for supplying different positions along the ultra-high frequency line with phase shifted energy so as to produce a rotating magnetic field and wherein said ultra-high frequency line is supplied with power at two positions respectively in phase guadrature with respect to two other positions.

13. device as claimed in claim 12, further comprising phase shift means for producing a $\pi/2$ phase shift, said phase shift means comprising a directional coupler, said phase shift means inserted in a power supply path and means separating each of two output paths of said directional coupler into two further paths in phase opposition to each other.

14. A device as claimed in claim 1, further comprising means for generating an equipotential surface and the means for causing a current to flow through each conducting wire includes means to generate a trigonometric function to modulate current intensity in each conducting wire which is proportional to distance separating each conducting wire from said equipotential surface.

15. A device for generating and/or receiving an alternating magnetic field for an apparatus using nuclear magnetic resonance, in which substantially parallel conductors support a current corresponding to a homogeneous magnetic field in a volume circumscribed by said conductors and comprising phase rotation means for producing a $\pi/2$ phase shift between current flowing in different ones of said parallel conductors facilitating production of a rotating magnetic field, said phase rotation means comprising a 3 db coupler and a duplexer connected between a source of electrical current and said parallel conductors.

16. A device as claimed in claim 15, wherein said phase rotation means further comprises means for supplying, in phase opposition, conductors diametrically opposite each other across said circumscribed volume.

* * * * *